United States Patent [19]

Borsuk et al.

[11] Patent Number: 4,521,896
[45] Date of Patent: Jun. 4, 1985

[54] SIMULTANEOUS SAMPLING DUAL TRANSFER CHANNEL CHARGE COUPLED DEVICE

[75] Inventors: Gerald M. Borsuk, Washington, D.C.; Edwin E. Chesson, Odenton, Md.; Jerome C. Beard, Pasadena, Md.; Thomas K. Lisle, Jr., Baltimore, Md.

[73] Assignee: Westinghouse Electric Co., Pittsburgh, Pa.

[21] Appl. No.: 378,461

[22] Filed: May 14, 1982

[51] Int. Cl.³ .................. G11C 19/28; H01L 29/78; H01L 29/04
[52] U.S. Cl. ........................... 377/60; 377/61; 357/24; 357/59
[58] Field of Search ............... 357/24, 59; 377/57–63

[56] References Cited

U.S. PATENT DOCUMENTS

| | | | |
|---|---|---|---|
| 3,760,202 | 9/1973 | Kosonocky | 357/24 |
| 3,858,232 | 12/1974 | Boyle et al. | 357/24 |
| 4,032,867 | 6/1977 | Engeler et al. | 357/24 |
| 4,210,825 | 7/1980 | Crochiere et al. | 357/24 |
| 4,216,574 | 8/1980 | Feist | 357/24 M |

OTHER PUBLICATIONS

Nagashima et al., "CCD Analog Processor" Toshiba Review No. 130 (Nov.–Dec. 1980), pp. 30–34.
Sealer et al., "A Dual Differential Charge–Coupled Analog Delay Device" IEEE J. Solid-State Circuits, vol. SC-11 (2/76), pp. 105–108.
Esser, "Peristaltic Charge Coupled Devices . . . " in Jespers et al., Eds., Solid State Imaging, Noordhoff, Leyden, 1976, pp. 343, 354–355, 364–365, 380–387, 408–411, 418–421.

Primary Examiner—Gene M. Munson
Attorney, Agent, or Firm—W. E. Zitelli

[57] ABSTRACT

A dual transport channel charge coupled device for coherently processing two analog signals in a bandwidth compression mode of operation, especially for use in a high resolution coherent radar system, is disclosed. An input charge injection stage is included for each transport channel. The input stages are dependently operative to simultaneously inject charge quantities correspondingly representative of concurrent samplings of the two analog signals being processed into their corresponding associated transport channels. Each transport channel comprises N multi-phase controlled stages in an in-line arrangement with the stages of one transport channel respectively corresponding to the stages of the other, the stages being operative to transport the simultaneously injected charge quantities concurrently along their corresponding channels. Further included are two output buffer amplifier stages respectively corresponding to the transport channels, which are operative to convert the charge quantities transported simultaneously from the dual channels into a coherent time series of analog signals representative thereof. More specifically, the dual input charge injection stages are dependently operative with a common sampling gate to simultaneously input charge quantities into their correspondingly associated transport channels at sampling rates up to at least 60 megahertz. Accordingly, at a subsequent time, the stored charge quantities may be transferred from the dual channel charge coupled device at a much slower rate, say on the order of 2 megahertz, for example.

1 Claim, 13 Drawing Figures

SIMULTANEOUS SAMPLING DUAL TRANSFER CHANNEL CHARGE COUPLED DEVICE

BACKGROUND OF THE INVENTION

The present invention relates to charge coupled devices in general, and more particularly, to a dual transport channel charge coupled device for coherently processing two analog signals in a bandwidth compression mode of operation.

A system that performs coherent processing like a high resolution coherent radar system, for example, must preserve the phase information of its intermediate signals in order to maintain system integrity. In a radar receiver, the received radar signals are generally mixed down in frequencies to the video range with a plurality of mixing stages. Quadrature mixing is usually performed at the final down-conversion stage and the resulting in-phase and quadrature channels may be processed independently prior to recombination in a signal processor, like an FFT, for example. In order to maintain accuracy, the independent processing of the in-phase and quadrature signals must not destroy the phase and gain matching properties of the two quadrature channels. Conventional processing uses an analog-to-digital (A/D) converter to sample each quadrature channel for subsequent digital processing. To preserve the phase matching properties between channels, this digital conversion sampling must ideally occur at precisely the same instant. Any time mismatch in sampling translates directly into a phase mismatch, and the magnitude of the phase mismatches that occur under these conditions are proportional to the signal frequency.

Presently, radar and communication systems are being developed that require quadrature sampling time matching to be within tens of picoseconds. This time match requirement cannot be guaranteed by presently available circuits.

SUMMARY OF THE INVENTION

A dual transport channel charge coupled device for coherently processing two analog signals in a bandwidth compression mode of operation includes an input charge injection stage for each transport channel, dual transport channels, and an output buffer amplifier stage for each transport channel. In accordance with the present invention, the input charge injection stages are dependently operative to simultaneously inject charge quantities correspondingly representative of concurrent samplings of the two analog signals being processed into their correspondingly associated transport channels. Each transport channel comprises N multi-phase controlled stages in an in-line arrangement with the stages of one transport channel respectively corresponding to the stages of the other transport channel. The corresponding stages of the dual transport channels are operative to transport the simultaneously injected charge quantities concurrently along their corresponding channels. Each output buffer amplifier stage is operative to convert the charge quantities transported simultaneously from the dual channels into a coherent time series of analog signals representative thereof. More specifically, the input charge injection regions include a common sampling gate which is operative to effect the simultaneous injection of charge quantities into their correspondingly associated transport channels. With this structure, the dual input charge injection stages are dependently operative to simultaneous input charge quantities into their correspondingly associated transport channels at a sampling rate of up to at least 60 megahertz.

In one embodiment, each input charge injection stage is operative in a partition mode and comprises a charge injection region operative in response to a first bias signal to generate a predetermined charge flow, and first, second and third gates structurally arranged to adjust, sample and modulate the charge generated by the charge injection region associated therewith. Each first gate is disposed in juxtaposition with its corresponding charge injection region along the width of the transport channel thereof and operative in response to a second bias signal to adjust the generated charge flow to an appropriate level. The second gate is common to both input charge injection stages and is disposed in juxtaposition with both first gates along both channel widths. The second gate is operative in response to a timing signal common to both input injection stages to sample simultaneously the adjusted charge flow in each input charge injection stage. Moreover, the third gate is disposed in juxtaposition with the second gate along the transport channel width corresponding thereto and is operative in response to a corresponding one of the two analog signals being processed to modulate the sampled charge quantity in proportion to the signal levels of said one analog signal concurrent with said corresponding sampling by the second gate. In this embodiment each transport channel is a peristaltic transport channel comprising a semiconductor substrate of a first conductivity type and an upper layer of a second conductivity type. Preferably, the first conductivity type is a P-type and the second conductivity type is an N-type. The upper layer may be either an implant region or an epitaxial layer disposed on the substrate at least across each transport channel.

DESCRIPTION OF THE PREFERRED EMBODIMENT

Figure 1:
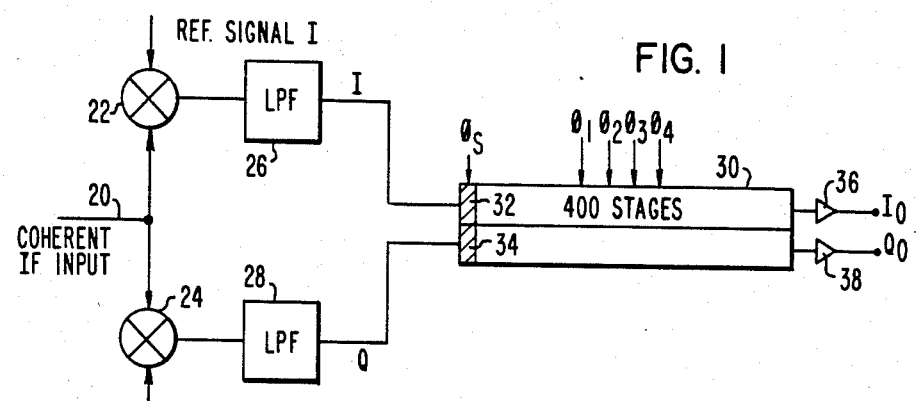
FIG. 1 depicts a block diagram schematic of a suitable environment for an embodiment of the present invention.

A block diagram schematic of a suitable environment for an embodiment of the present invention is shown in FIG. 1. The schematic diagram is representative of a portion of a coherent radar receiver system. Typically, a received radar signal after undergoing a number of down-conversion mixing stages may be eventually applied to a final down-conversion mixing stage as shown by the schematic diagram of FIG. 1. Referrring to FIG. 1, the coherent IF input signal 20 may be applied to the inputs of two mixers 22 and 24 for mixing purposes. Reference signal I and reference signal Q may be mixed with the IF signal 20 in mixers 22 and 24, respectively. The resulting in-phase I and quadrature Q signals may be conducted through low pass filters 26 and 28 for the filtering of unwanted signals and the substantial elimination of certain aliasing problems.

In accordance with the present invention, the I and Q channels may be supplied to respective inputs of a dual transport channel charge coupled device 30. Accordingly, the charge coupled device 30 is operative to coherently process the two analog signals I and Q in a bandwidth compression mode of operation (e.g. fast clocking input, sampling followed by slow clocking readout). For the present embodiment, the device 30 may include 400 charge transport and storage stages for the I and Q channels by using a dual 400 stage serial in/serial out in-line charge coupled device structure. Each stage of the dual transport channels of the device 30 may be multi-phase controlled synchronously by the timing signals $\phi_1$–$\phi_4$. The in-line arrangement of the stages permits the stages of one transport channel to respectively correspond to the stages of the other transport channel so that corresponding stages of the dual transport channels of the device 30 may be operated concurrently to transport injected charge quantities coherently along their corresponding channel paths.

Charge injection stages 32 and 34 respectively corresponding to the transport channels I and Q are disposed at the inputs thereof and are dependently operative to simultaneously inject charge quantities, correspondingly representative of concurrent samplings of the two analog signals I and Q being processed, into their correspondingly associated transport channels. The charge sampling injection process is governed by a common timing signal $\phi_S$. Output buffer amplifier stages 36 and 38 are disposed at the outputs of their corresponding I and Q transport channels and are operative in the present embodiment to convert the charge quantities transported simultaneously from the dual channels I and Q into a coherent time series of analog signals $I_O$ and $Q_O$ representative thereof.

Concurrent charge samplings of the I and Q channels may be simultaneously injected into their correspondingly associated transport channels at sampling rates of up to 60 megahertz or greater in accordance with the dependent operation of the dual input charge injection stages 32 and 34. Accordingly, as part of the bandwidth compression mode of operation, the dual transfer channel charge coupled device 30 may, at a subsequent time, transfer out the stored charge data at a much lower clock rate, say on the order of 2 megahertz, for example. Consequently, a much lower speed A/D converter may be used to digitize the signals $I_O$, $Q_O$ for subsequent digital processing.

More specifically, the dual transfer channel charge coupled device embodiment 30 described in connection with FIG. 1 has a common sampling gate for the input charge injection stages 32 and 34 which is actuated by the high speed sampling waveform of signal $\phi_S$. Thus, a sample command over signal $\phi_S$ may partition signal charge in both the I and Q channel registers of the device 30 limited in speed only by the rise time of the sample pulse of the signal $\phi_S$ and the sample time mismatch is limited by the time necessary for the pulse to propagate across the width of the electrode of the sampling gate as it extends across the area of the input charge injection stages 32 and 34. A characteristic time constant for the present embodiment assuming a lump capacitance model may be on the order of 5 picoseconds. Accordingly, the common sampling gate electrode arrangement in connection with the present invention will become more apparent from the more detailed description of the preferred embodiment provided herebelow.

Figure 2:
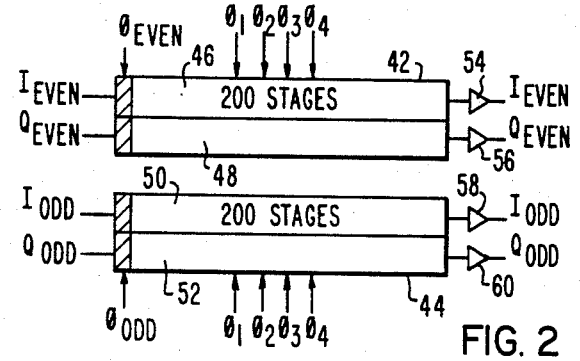
FIG. 2 is a schematic block diagram representative of an alternate embodiment of the present invention.

An alternate embodiment of the present invention is shown as a dual duplex charge coupled device in the block diagram schematic of FIG. 2. This alternate embodiment includes two dual transfer channel charge coupled devices 42 and 44, each with half the number of stages required for the embodiment of FIG. 1. For example, the embodiment of FIG. 1 exhibited a 400 stage device wherein the alternate embodiment depicted in FIG. 2 may include two 200 stage staggered charge coupled device structures per channel to achieve the same 400 storage elements. The alternate embodiment has potentially better performance capability in terms of high speed clock rate and transfer efficiency because a charge packet need only undergo half as many transfers from input to output and is clocked at half the high speed clock rate as that of the single in-line multi-stage device as described in connection with the embodiment of FIG. 1.

More specifically, in connection with the embodiment of FIG. 2, each dual transfer channel charge coupled device 42 and 44 includes its own dual input charge injection stages 46, 48 and 50, 52, respectively, and dual output buffer amplifier stages 54, 56 and 58, 60, respectively. Similarly, charge quantities may be concurrently transferred through the dual channel charge coupled devices 42 and 44 utilizing the multi-phase controlled signals $\phi_1$–$\phi_4$, the only difference being that the phase controlled transfer operations may be alternately processed between the two devices 42 and 44. Likewise, simultaneous charge quantity injection may also be alternately conducted between the devices 42 and 44 utilizing the signals $\phi_S$ even and $\phi_S$ odd. A typical operation may include injecting and transferring samples of the I and Q channels taken at even time intervals through the device 42 and samples taken at odd time intervals through the device 44. It is understood that some type of gating arrangement may be included at the output amplifier stages 54, 56, 58 and 60 to recombine the $I_{even}$ and $I_{odd}$ converted output signals and $Q_{even}$ and $Q_{odd}$ converted output signals for subsequent processing. However, circuitry of this type is considered well known to anyone skilled in the pertinent art and is not considered in any way a part of the present invention, therefore will not be described in any greater detail.

Figure 3:
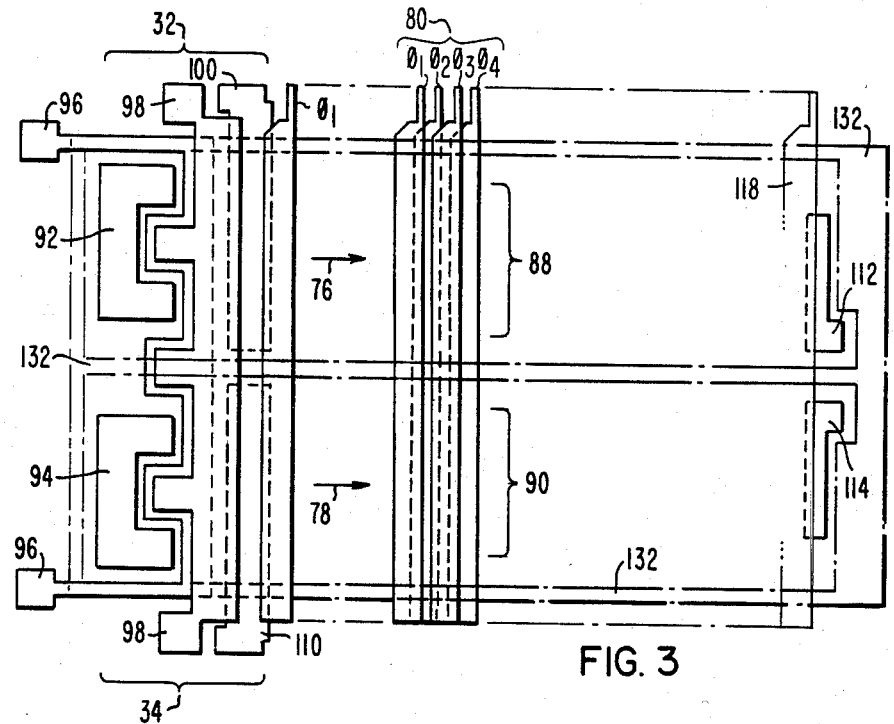
FIGS. 3 and 4 are illustrations of representative plan and cross-sectional views, respectively, of a peristaltic semiconductor structure which is suitable for embodying a dual transport channel charge coupled device.
Figure 4:
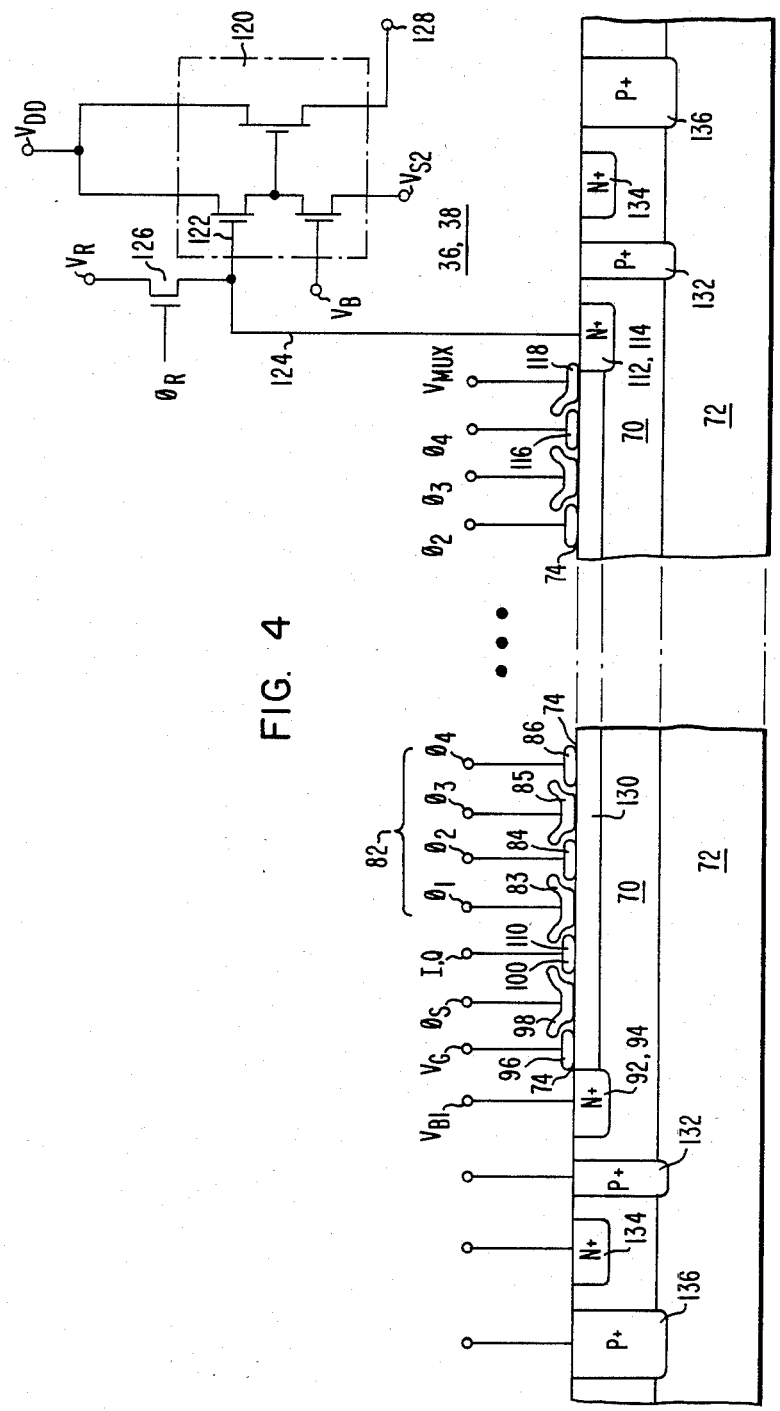

A peristaltic silicon semiconductor structure was found suitable for embodying the dual transport channel charge coupled device described in connection with FIGS. 1 and 2. Illustrations of representative plan and cross sectional views of the peristaltic semiconductor structure are shown in FIGS. 3 and 4, respectively. A partition mode semiconductor structure is used for each of the input charge injection stages of the transport channels. Referring to FIGS. 3 and 4, an upper layer of a second conductivity type formed for example by epitaxial deposition or ion implantation of an N-type semiconductor, for example, is disposed over the surface of a semiconductor substrate 72 of a first conductivity type, like a P-type semiconductor material. An insulator material 74, like silicon dioxide, for example, may be disposed over the surface of the upper layer 70 to provide insulation for the various gating electrodes of the dual channel charge coupled devices.

Gating electrodes which form the dual peristaltic N-stage in-line transport channels are assembled over the epitaxial layer 70. The formed parallel charge transport paths are shown by the direction of the arrows 76 and 78. Each stage of the dual transport channels include a common insulator separated multi-gate structure as shown typically by the grouping 80 in FIG. 3 and 82 in FIG. 4. In the present embodiment, the multi-gate structure includes four conventional overlapping gate electrodes shown typically by the electrodes 83, 84, 85 and 86 in the representative cross-sectional view of FIG. 4. These gate electrodes, for the present embodiment, extend commonly over the channel widths 88 and 90 of the transport channels 76 and 78, respectively. The multi-gate electrode structures are disposed over the oxide material 74 and arranged cascadedly along the length of the transport paths 76 and 78 to constitute a dual in-line gate electrode structure arrangement.

Each partition mode input charge injection stage 32 and 34 includes an input charge injection region 92 and 94 which may be of a second conductivity type higher in conductivity (N+) than the epitaxial layer 70. The regions 92 and 94 are each disposed in the epitaxial layer 70 at one end, the input end, of its corresponding transport channel. A common enable gate, commonly referred to as a DC gate, is disposed on the insulator layer 74 in juxtaposition with the charge injection regions 92 and 94 along the widths of the corresponding transport channels. In accordance with the present invention, a partition gate 98 which is common to both input charge injection stages 32 and 34 is disposed on the insulation layer 74 in juxtaposition with the enable gate 96 extending at least along the widths of both transport channels. In addition, analog input gates 100 and 110 are disposed on the insulation material 74 in juxtaposition with the partition gate 98, each along the width of its corresponding transport channel. The enable, partition, and analog gates 96, 98 and 100, 110, respectively, are mutually insulated from one another with the insulation material 74. Preferably, the analog input gates 100 and 110 are disposed in juxtaposition with the first gate electrode of the initial stage of the transport channel correspondingly associated therewith.

In operation, each charge injection region 92 and 94 is coupled to a bias signal shown typically as $V_{B1}$ and is responsive to thee signal $V_{B1}$ to generate a predetermined charge flow. The first gate or enable gate 96 may be coupled to another bias signal shown typically as $V_g$ and is responsive to the second bias signal to adjust the generated charge flow to an appropriate level. The common partition gate or second gate 98 may be coupled to the sampling signal $\phi_S$, which is common to both input injection stages 32 and 34, and is responsive to the sample timing signal $\phi_S$ to sample simultaneously the adjusted charge flow in each input charge injection stage 32 and 34. The analog input gate or third gates 100 and 110 may be coupled to their corresponding I and Q channel signal, respectively, and are responsive to the coupled analog signal to modulate the sampled charge quantity in proportion to the signal level thereof concurrent with the corresponding sampling interval. In practice, the analog signal applied correspondingly to the gates 100 and 110 determines how much charge is held in the region under the gate electrode thereof by modulating the depletion well for holding charge in the upper layer 70. This modulated charge quantity is representative of the analog signal I or Q at the time of sampling.

The output charge transfer stages 36 and 38 corresponding to the transport channels I and Q each include an output charge transfer region 112 and 114 of a second conductivity type (N+) disposed in the upper layer 70 at the other end, the output end, of its corresponding transport channel. Preferably, the output charge transfer regions 112 and 114 are disposed in juxtaposition with a charge modulation electrode 118 which cascadedly follows the last charge transfer gate electrode 116 as shown in FIG. 4.

Moreover, the output charge transfer stages 36 and 38 may also include an output buffer amplifier comprising a circuit combination of field effect transistors which in combination form a buffered amplifier stage similar in construction to that shown within the dashed line block 120 of FIG. 4. The input 122 of each buffered amplifier 120 may be coupled to its corresponding output charge transfer region 112, 114 over a circuit path 124. Under certain conditions, the circuit path 124 may include stray or undesirable capacitance to retain charge during the charge transfer operations of the charge coupled devices. In these cases, the output buffer amplifier 120 may include a means for removing the charge retention on the circuit path 124 at prespecified times. To alleviate this situation in the present embodiment, another field effect transistor 126, having its source and drain coupled between a reference potential $V_R$ and the circuit path 124 is operative under a gate reset control signal $\phi_R$ to, at times, discharge the circuit path 124.

In either case, the circuit combination 120 is operative to convert the charge quantity of the output charge transfer region 112 or 114 into an analog signal representative thereof at its output 128. Thus, as charge is transferred from the dual transfer channels, the output buffer amplifier stages 36 and 38 become operative to convert the charge quantities transported simultaneously from the dual channels into two coherent time series of representative analog signals at the output 128.

In some cases, an implant region of phosphorous, for example, may be included at the surface of the upper layer 70 across each transport channel. The implant region 130 may be of a second conductivity type (N+), but higher in conductivity than the upper layer 70. A substantial difference in the lifetime of carriers in a buried channel may exist between the two types of channels, high energy implant or epitaxial deposition. Ion implanted bodies may have a high lifetime corresponding to low leakage current while the lifetime of the epitaxial material may be somewhat lower, resulting in higher leakage. Leakage current is extremely important because it directly reduces device dynamic range with increasing temperature. Very low leakage, 1 to 10 nanoamperes/cm$^2$, is desirable. An arsenic implant, for example, may be used to grade the charge coupled device channel for high storage capacity resulting in large dynamic range.

Still further, an isolation region of a first conductivity type (P+) higher in conductivity than the semiconductor substrate 72 may be disposed through the epitaxial layer 70 to the substrate 72 as a band 132 about the periphery of each transport channel I and Q, and the input charge injection and output charge transfer stages 92, 94 and 36, 38, respectively corresponding thereto. This band region is commonly referred to in semiconductor technology as a channel stop. Other isolation expedients such as a leakage ring 134 and/or an isolation ring 136, for example, may also be disposed about the periphery of the channels to further enhance the processing operations thereof.

Figure 5:
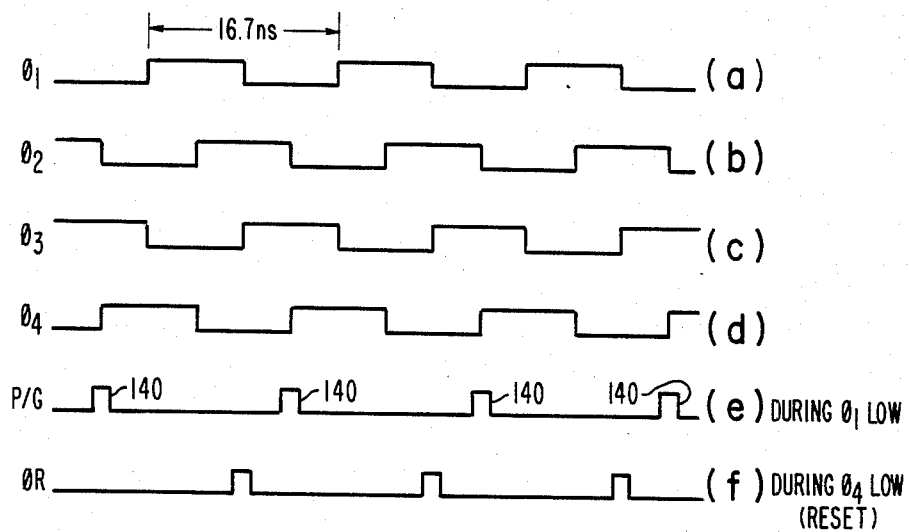
FIG. 5 illustrates typical timing waveforms a–f for operating the embodiment of a dual in-line transport channel charge coupled device corresponding to that shown in FIG. 1.
Figure 6:
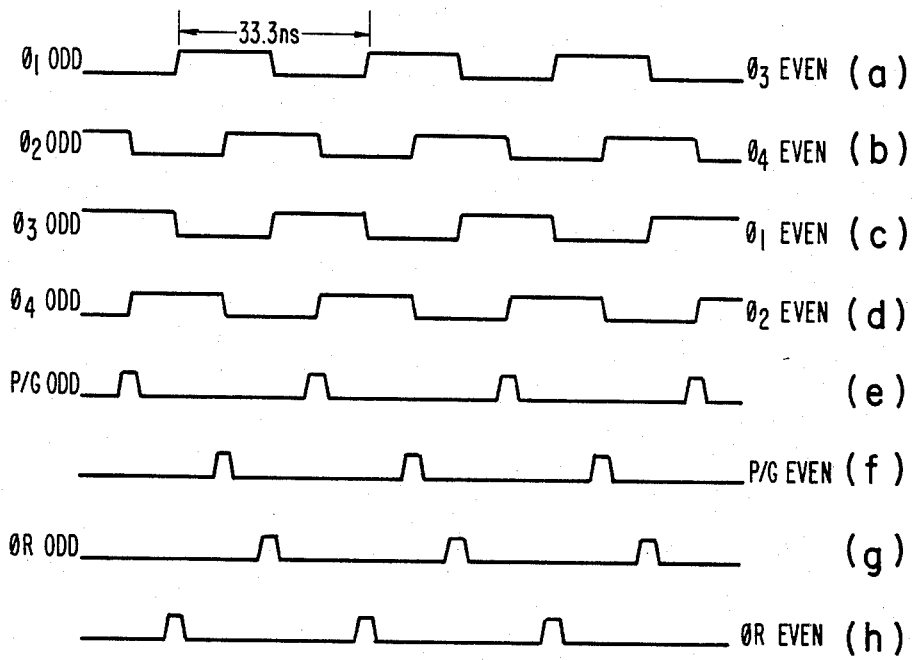
FIG. 6 illustrates typical timing waveforms a–h for operating the embodiment of a dual duplex in-line transport channel charge coupled device corresponding to FIG. 2.

The timing waveforms 5a–5f correspond to exemplary operations of the dual in-line embodiment of FIG. 1 and similarly, the timing waveforms 6a–6h correspond to exemplary operations of the dual duplex in-line embodiment of FIG. 2. For these operational examples, the input samplings of the I and Q channels may be taken when the partition gate P/G, common to both CCD channels, makes a voltage transition from positive to negative potential as exemplified at the points 140 of the timing waveform 5e. Since the charge coupled device embodiment described inconnection with FIGS. 3 and 4 is a four phase structure, the timing signals $\phi_1$–$\phi_4$ may be used to transfer charge in and out of their corresponding channels in a conventional charge transfer manner. Their phasing relationships are exemplified by the timing waveforms 5a–5d, respectively. At a 60 megahertz transfer rate, the period of these waveforms is approximately 16.7 nanoseconds. Also in the timing waveforms of FIG. 5 is the reset signal $\phi_R$ for discharging the output circuit path periodically during the charge transfer operations, refer to waveform 5f.

For the dual duplex in-line embodiment as depicted in FIG. 2, the timing waveforms 6a–6d exhibit the $\phi_1$–$\phi_4$ clocks for operation of the multi-phase controlled gate electrodes of the odd and even dual transfer channel charge coupled devices. Note that the clocks $\phi_1$–$\phi_4$ are generated with a 50% duty cycle. In addition, timing waveforms 6e and 6f exhibit the partition gate exitation times for simultaneous charge transfer between the even and odd devices 42 and 44. And finally, the timing waveforms 6g and 6h exhibit the reset timing relationships between the odd and even devices 42 and 44. Note that because the number of stages are now staggered between two different dual channel charge transfer devices 42 and 44, the period of the multi-phase gate control signals 6a–6d may be increased to twice that of the in-line embodiment (i.e., for 60 MHz operation, 33.3 nanoseconds).

A dual in-line N-stage serial in/serial out peristaltic charge coupled device structure will be more specifically described in connection with FIGS. 7 through 13 herebelow. The gating electrodes of this particular design have been fabricated using two layers of polysilicon material. The gates such as shown at 96, 100, 110, 84 and 86, for example, may be considered as the first layer polysilicon or polysilicon 1. Accordingly, the gates 98, 83, 85 may be considered as the second polysilicon level or polysilicon 2. The common polysilicon partition gate 98 in the present design is overlayed with a metallic layer, such as aluminum, for example, to lower resistance. The peristaltic charge coupled device is a four phase structure having gate lengths of approximately 5 micrometers each. This gate length coupled with the peristaltic structure of the silicon semiconductor (e.g., an N-channel body approximately 4 micrometers thick) makes the device capable of high charge transfer operation in excess of 150 megahertz with high transfer efficiency ($\epsilon$+0.9999). In addition, the output amplifier stages of the present design are capable of 15 megahertz bandwidth operation.

In general, the charge coupled device fabrication process is generically similar to the processes developed for peristaltic or deep buried channel charge coupled devices. The deep buried channel body may be formed by either an implant or deposition of an expitaxial layer. In fabricating the present design, the process sequence may take as many as 56 steps and have as many as 14 masks and 14 maskings.

Figure 7:
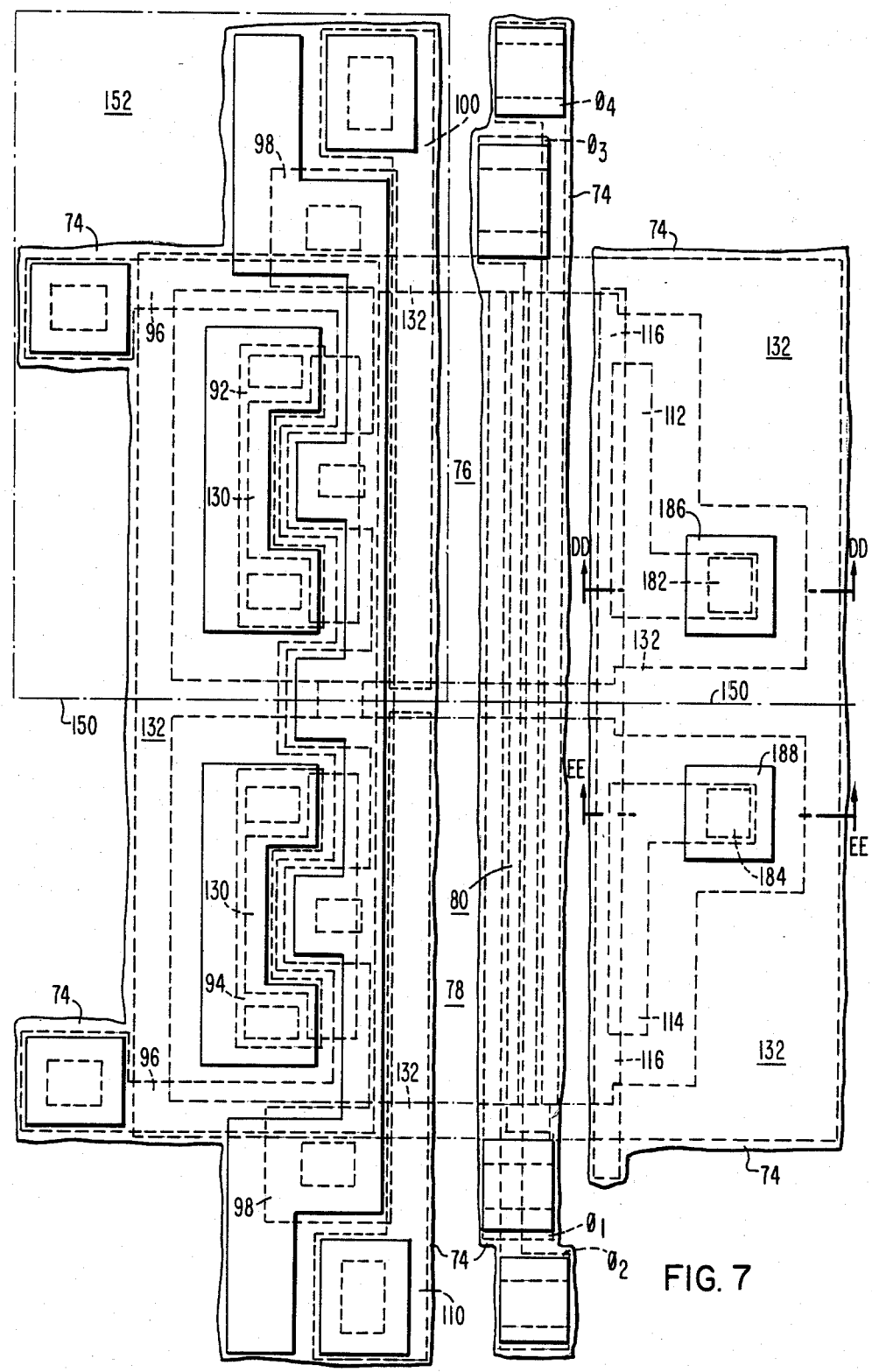
FIG. 7 is a plan view of a dual in-line N-stage serial in/serial out peristaltic charge coupled device structure which has been fabricated to embody the principles of the present invention.

More specifically, the integrated circuit suitable for embodying the principles of the present invention is shown in a plan view in FIG. 7. The reference numerals used to describe the various elements correspond to the reference numerals used in the descriptions of the illustrations depicted in FIGS. 3 and 4. The layout of the integrated circuit is similar to that described in connection with the embodiment of FIGS. 3 and 4 and therefore will not be described in great detail here other than to point out any differences or modifications to the embodiment already described. It is understood that the integrated circuit depicted in FIG. 7 may include a multi-stage dual transport channel such as that shown in connection with the charge coupled devices of FIGS. 1 and 2. For example, in the dual in-line structure of FIG. 1, the charge coupled device 30 included 400 stages, while the dual duplex structure depicted in FIG. 2 included only half as many stages in each of its staggered charge coupled devices 42 and 44. It is further understood that the present invention should not be limited to any specific number of stages, but rather be construed according to the recitation of the appended claims.

Figure 8:
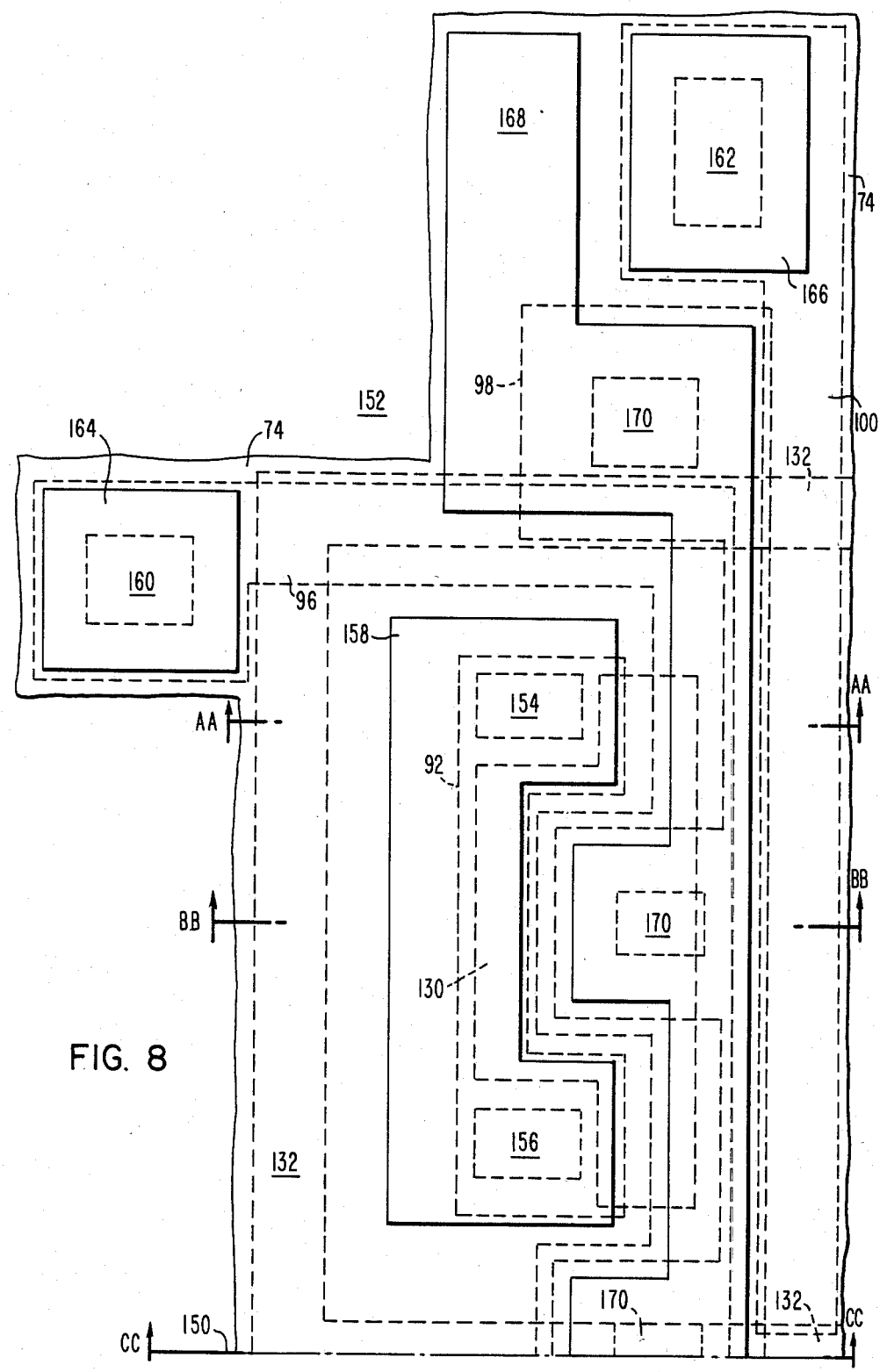
FIG. 8 is a magnified plan view of one of the charge injection stages of the peristaltic charge coupled device as depicted in FIG. 7.

The integrated circuit depicted in plan view in FIG. 7, by design, is made substantially symmetrical about its central axis 150. Thus only one-half of the preferred structure need be considered in the description thereof. More particularly, the input charge injection stages are represented by an expanded plan view of that portion of the integrated circuit shown within the dot-dashed lines 152 of FIG. 7. This magnified portion 152 of the integrated circuit is depicted in FIG. 8. Referring to FIG. 8, window areas 154 and 156 are provided through the oxide layer 74 to allow for a metallic contact layer 158 disposed over the oxide layer 74 to make contact through the windows 154 and 156 to the input charge injection region 92. Similarly, windows 160 and 162 provide openings through the oxide layer 74 so that metallic contact pads 164 and 166 disposed over the oxide layer 74 may make contact with their respectively corresponding enable and analog input gates 96 and 100, respectively. Moreover, the polysilicon partition gate 98 is overlayed with a metallic layer 168 which is disposed on the insulation or oxide layer 74 substantially over the region covering the polysilicon partition gate 98. One or more windows 170 may be provided through the insulation layer 174 to permit contact between the metallic layer 168 and the polysilicon partition gate 98.

Figure 9:
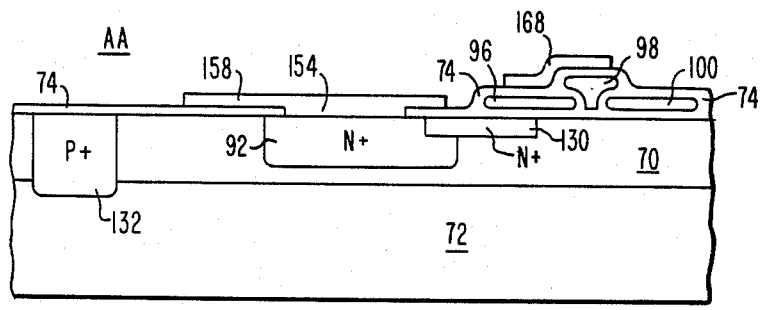
FIGS. 9, 10 and 11 are selected cross-sectional views of the charge injection stage as depicted by the plan view of FIG. 8 provided to aid in the perspective thereof.
Figure 10:
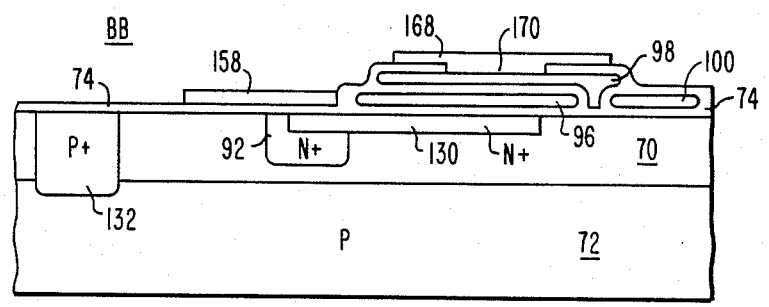
Figure 11:
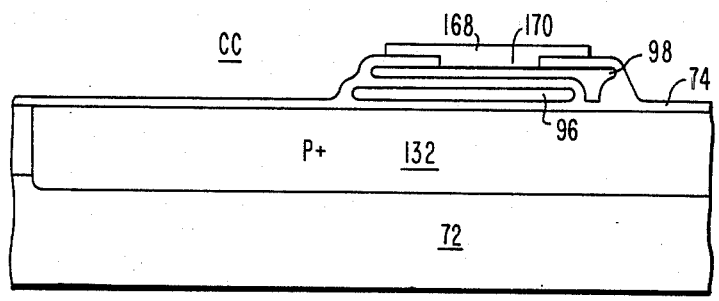

Cross-sectional views AA, BB, CC, DD and EE of the integrated circuit described in connection with FIGS. 7 and 8 were taken at selected places where some confusion may arise when viewing the plan outlines of FIGS. 7 and 8. For example, the cross-sectional view AA as shown in FIG. 9 is representative of a cross section of the input charge injection stage wherever there is a window opening in the oxide 74 for contact to the input charge injection region 92 or 94. The cross-sectional view BB as shown in FIG. 10 is representative of a cross section of the control region of each input charge injection stages where a window is opened in the oxide 74 to permit contact between the metallic layer 168 and partition gate 170. Finally, the cross-sectional view CC as shown in FIG. 11 is taken along the central axis 150 illustrating the isolation region 132 and the common enable and partition gates 96 and 98, respectively, as they extend between the input charge injection stages. Also in the view CC of FIG. 11, another window 170 is shown provided through the insulation layer 74 so that contact may be made between the metallic layer 168 and the partition gate 98. The cross-sectional views of FIGS. 9, 10 and 11 are felt self-descriptive when taken in connection with the descriptions of the embodiments depicted in FIGS. 7 and 8 and therefore, no further description is believed required.

Figure 12:
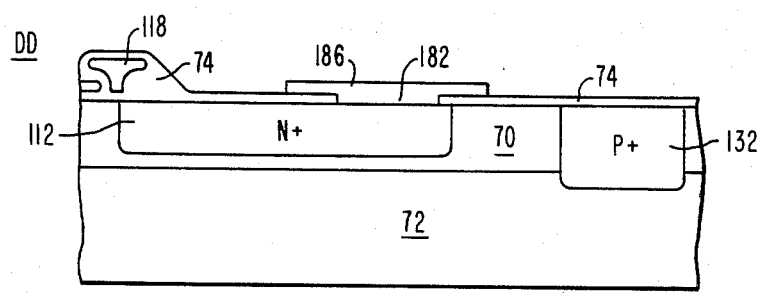
FIGS. 12 and 13 are representative cross-sectional views of the output transfer stages of the dual transfer channel peristaltic charge coupled device embodiment depicted in FIG. 7 and are provided to aid in the perspective thereof.
Figure 13:
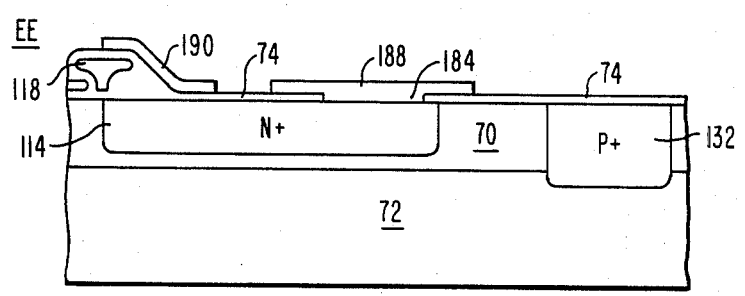

The central or channel portion of the dual channel charge coupled device as depicted in FIG. 7 includes a multi-stage design wherein the repectively corresponding stages of the dual channels are common controlled by four phase controlled overlapping gate electrodes as exemplified by the region 180. At the output end of the dual channel charge coupled device structure there exists respective output charge transfer regions 112 and 114. Contact windows 182 andd 184 are provided through the insulation layer 74 so that metallic contact pads 186 and 188 may make contact with the output charge transfer regions 112 and 114, respectively. Reference may also be made to the cross-sectional views DD and EE of the output transfer stages as shown in FIGS. 12 and 13, respectively, for a better perspective of the structures thereof.

Integrated circuits similar in design to the embodiment described in connection with FIGS. 7–13 have been tested at both the wafer probe level and in certain specially constructed testing hardware adapted to fully exercise operationally the various aspects of the present invention. Particularly, these integrated circuits were exercised at 60 megahertz fast input clock rates and 2 megahertz slow output clock rates as part of a bandwidth compression mode of operation and demonstrated charge transfer efficiencies of better than 0.9999.

While the preferred embodiment has been described in connection with a silicon semiconductor type embodiment supra, it is understood that other type charge coupled device structures, like gallium arsenide or indium phosphorous, for example, may also be suitable for embodying the present invention. Thus, the present invention should not be limited to any one specific embodiment, but rather construed in the breadth and broad scope cited in the appended claims.

We claim:

1. A dual transport channel peristaltic charge coupled device (PCCD) for coherently processing two analog signals at simultaneous charge injection sampling frequencies of up to at least 60 MHz, said PCCD comprising:

a semiconductor substrate of a first conductivity type;

an upper layer of a second conductivity type disposed on the surface of said substrate;

an insulator layer disposed on said upper layer;

dual peristaltic N-stage in-line transport channels having parallel charge transport paths, respectively corresponding stages of the transport channels including a common insulatedly separated multi-gate structure disposed over said insulator layer, said multi-gate structures arranged cascadedly along the length of the charge transport path respectively over each in-line stage thereof; and dual partition mode input charge injection stages corresponding to said dual transport channels, each injection stage including:

an input charge injection region of a second conductivity type disposed in the surface of said upper layer at one end of its corresponding transport channel, said injection region being of a higher conductivity than said upper layer, both injection stages including:

a charge sampling gate region of polysilicon material, common to both charge injection regions, disposed within said insulator layer and extending across the width of both transport channels between said charge injection regions and corresponding charge transport channels with portions thereof in juxtaposition with said charge injection regions; and a charge sampling gate metallic contact layer disposed on said insulator layer over said charge sampling gate region across the width of both transport channels and making contact with said polysilicon sampling gate region through a multiplicity of window sections removed from said insulator layer, said contact windows being distributed across the width of said polysilicon sampling gate region to sectionalize the distributed parameter impedance thereof to reduce the signal propagation time across said width, thereby improving both the frequency and time matching of simultaneous input charge injection sampling of said dual charge injection stages to the extent necessary for simultaneous charge injection frequencies of up to at least 60 MHz.

* * * * *